United States Patent [19]

Ladd, Jr.

[11] 4,265,934
[45] May 5, 1981

[54] METHOD FOR MAKING IMPROVED SCHOTTKY-BARRIER GATE GALLIUM ARSENIDE FIELD EFFECT DEVICES

[75] Inventor: Glenn O. Ladd, Jr., Agoura, Calif.

[73] Assignee: Hughes Aircraft Company, Culver City, Calif.

[21] Appl. No.: 879,651

[22] Filed: Feb. 21, 1978

Related U.S. Application Data

[63] Continuation of Ser. No. 640,124, Dec. 12, 1975, abandoned.

[51] Int. Cl.³ .................... H01L 21/302; H01L 29/48
[52] U.S. Cl. .......................... 427/84; 29/571; 156/649; 156/662; 148/1.5; 148/175; 427/88; 427/89; 430/314
[58] Field of Search ............... 357/22, 15; 29/571, 29/580; 427/84, 88, 89; 156/662, 649; 148/1.5, 175; 430/314

[56] References Cited

U.S. PATENT DOCUMENTS

| | | | |
|---|---|---|---|
| 3,675,313 | 7/1972 | Driver | 29/571 |
| 3,678,573 | 7/1972 | Driver | 29/571 |
| 3,762,945 | 10/1973 | Di Lorenzo | 427/84 |
| 3,861,024 | 1/1975 | Napoli | 29/579 |
| 3,898,353 | 8/1975 | Napoli | 29/571 |
| 3,914,784 | 10/1975 | Hunsperger | 357/15 |
| 4,040,168 | 8/1977 | Huang | 357/15 |
| 4,077,111 | 3/1978 | Driver | 29/571 |

FOREIGN PATENT DOCUMENTS 1347874  2/1974  United Kingdom .

OTHER PUBLICATIONS

Kohn, V-Shaped-Gate . . . Performance, Electronics Letters, vol. 11, No. 8 p. 160, (1975).

*Primary Examiner*—John D. Smith
*Attorney, Agent, or Firm*—Mary E. Lachman; George Tacticos; W. H. MacAllister

[57] ABSTRACT

A Schottky-barrier gate gallium arsenide field effect structure is made using a self-aligned gate fabrication technique. The resulting device includes source and drain regions, which are parts of a conducting channel formed through ion implantation or epitaxial growth or a combination of the two. A gate is formed on the same channel by first etching a portion of the channel between the source and the drain regions to form a gate window which then receives a Schottky-barrier gate electrode.

13 Claims, 7 Drawing Figures

METHOD FOR MAKING IMPROVED SCHOTTKY-BARRIER GATE GALLIUM ARSENIDE FIELD EFFECT DEVICES

This is a continuation of application Ser. No. 640,124, filed Dec. 12, 1975, abandoned.

FIELD OF THE INVENTION

This invention relates to field effect devices and a process for making same. More specifically it relates to a novel gallium arsenide field effect transistor having a self-aligned Schottky-barrier gate and the novel process for making same.

BACKGROUND

Field effect transistors have been known for many years and have been used extensively in many applications requiring among other things high input impedance, low input capacitance, high radiation tolerance and bilateral symmetry. Gallium arsenide field effect transistors are preferred over their silicon counterparts in certain high frequency operations because of their low noise and high power capabilities. One of the difficulties in processing gallium arsenide field effect transistors has been in making a reliable insulator on a gallium arsenide substrate. This problem has been by-passed by using Schottky-barrier gates to replace the insulated gates.

One important electrical parameter of a field effect transistor is its transconductance. Transconductance is the change of drain current caused by a change in the gate voltage. The external transconductance of a field effect transistor is increased as the ohmic resistance between the source and gate of the transistor is reduced. Another important device parameter adversely affecting the power gain of a field effect transistor is the drain-to-gate capacitance. The drain-to-gate capacitance should be as low as possible since it serves as a reverse feedback path for the output signal, and thus tends to reduce the power gain of the device. Both source-to-gate resistance and drain-to-gate capacitance are directly related to the geometric distances between the three regions of the transistor. To reduce the source-to-gate resistance and thus increase the transistor's transconductance, it is necessary to reduce the physical distance between the two regions. However, as this distance decreases, so does the breakdown voltage between them and this can become a limiting factor in the operation of the transistor. Therefore, it is important to have a process that can produce devices having the distances between the different regions kept within close tolerances.

PRIOR ART

One well-known gallium arsenide Schottky-barrier gate field effect transistor is described by Mr. S. M. Sze in "Physics of Semiconductor Devices," John Wiley, 1969, at page 410. Such devices are often constructed by growing an N-type gallium arsenide epitaxial layer on a semi-insulating gallium arsenide substrate. The source, gate and drain regions are formed on the epitaxial layer. The Schottky-barrier gate is usually made out of aluminum and is 1 $\mu$m to 3 $\mu$m long. The distance between gate and source is approximately equal to the distance between gate and drain and is approximately equal to the gate length, that is about 1 $\mu$m. The source and drain ohmic contacts are usually made of silver-germanium or gold germanium alloys.

Other more recent prior art devices have eliminated the need to grow the epitaxial layer and instead make use of ion implantation to form the different transistor regions. U.S. Pat. No. 3,912,546, which is assigned to the present assignee, describes a process for the fabrication of a GaAs Schottky-barrier gate field effect transistor, wherein initially a Schottky gate is formed over a section of the field effect transistor channel, and thereafter the gate metal is exposed to a bombardment of protons with sufficient energy to penetrate the metal and enter the field effect transistor channel region, thereby determining the conductivity of the channel.

U.S. Pat. No. 3,914,784, which is also assigned to the present assignee, describes certain GaAs field effect transistors wherein the active regions of the devices are formed by implanting suitable ions directly into a semi-insulating substrate.

All above-mentioned prior art devices have satisfactory performance up to a certain frequency level. To achieve an even higher frequency performance for GaAs field effect transistors there is a need for device geometries, and reproducible processes for making them, wherein some device regions can be made closer to each other and wherein the conductivity and thickness of the device channel can be more effectively controlled.

THE INVENTION

The general purpose of this invention is to provide certain novel gallium arsenide field effect transistors and a novel fabrication process therefor wherein a conducting channel is formed on a surface of a semi-insulating gallium arsenide substrate and a portion of this channel is selectively removed to provide a shallow conducting channel region between the two relatively thicker regions of the channel. Ohmic contacts are formed on the two thicker regions of the channel and a rectifying barrier is formed with the contiguous portion of the shallow conducting region of the channel.

The shallow conducting channel, which becomes the gate region of the device, can be formed through a selective etching of the channel. The etch mask also defines the gate metal dimension and controls the size of the gate and its proximity to the source and drain regions formed on the two unetched portions of the conducting channel.

A controlled etching of the gate region leaves a thin conducting channel which has the desired thickness and doping profile for the desired transconductance of the device. The conductivity and thickness of the gate region, or the intrinsic channel as this gate region is often referred to, can easily be monitored and allowed to vary in accordance with the ultimate use of the structure.

Therefore, since the source-gate region is thicker and has a lower resistance than the channel region, the source resistance can be lowered without moving the gate closer to the source. This makes the structure capable of operating at higher frequencies and with a higher signal-to-noise ratio than its prior art counterparts. Lower device noise results from lowering the source resistance. Similarly, the drain region can be placed somewhat further from the gate region to reduce the output capacitance and further increase the power gain of the device. This variation, of course, can be made only for some structures where the bidirectionality of the device is not as important as the power gain.

Accordingly, it is an object of this invention to provide certain novel field effect transistors capable of operating at higher frequencies than their prior art counterparts.

Another object of this invention is to provide a process for the fabrication of a field effect transistor having low source resistance, thus a high transconductance.

Another object of this invention is to provide a process for the fabrication of a field effect device having a gate region perfectly aligned to the intrinsic channel region.

Another object of this invention is to provide a process for self-aligned gate fabrication of gallium arsenide Schottky-barrier gate field effect transistors.

Another object of this invention is to provide a process for making GaAs field effect structures where the thickness and conductance of the intrinsic channel of the structure is controlled through etching.

Another object of this invention is to provide a process for making GaAs field effect transistors with superior frequency response than their prior art counterparts. This is achieved by a combination of a self-aligned gate fabrication and a progressive etching of the intrinsic channel region of the devices.

These and other objects of the invention will become more fully apparent in the following description of the accompanying drawings.

DRAWINGS

DETAILED DESCRIPTION

Figure 1:
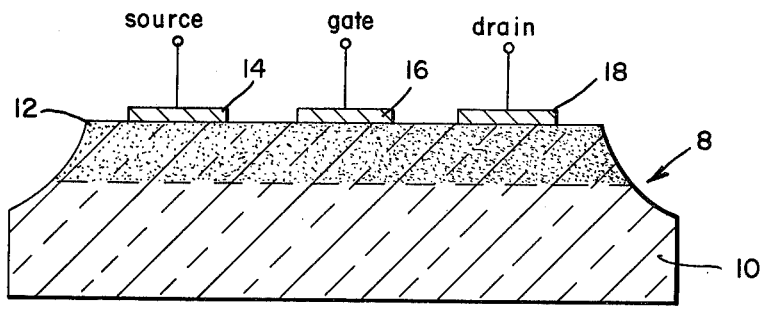
FIG. 1 is a diagrammatic cross-sectional view of a prior art Schottky-barrier gate field effect transistor.

Referring now to FIG. 1, there is shown one prior art gallium arsenide Schottky-barrier gate field effect transistor generally designated 8. The structure includes a semi-insulating gallium arsenide substrate 10, and an N-type gallium arsenide epitaxial layer 12. The device also includes on the epitaxial layer ohmic contacts 14 and 18 for the source and drain contacts, respectively, and a metal-semiconductor Schottky-barrier 16, for the gate of the transistor. Field effect transistors with this structure have a frequency cutoff point lower than that of the present invention. This is primarily due to the higher feedback resistance caused by the generally larger physical distances separating the source and gate regions. The self-aligned gate process introduced by the present invention makes possible the reproducible fabrication of field effect transistors with gate regions closer to the source regions and lower source-gate or feedback resistances.

Figure 2A:
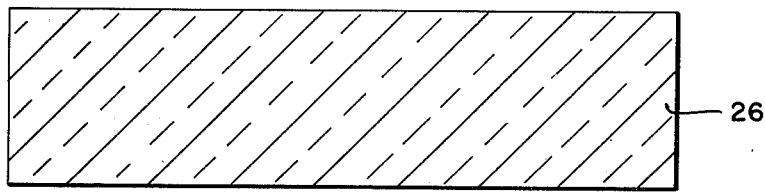
FIGS. 2a through 2f illustrate, in a series of schematic cross-sectional views, a sequence of some of the most important process steps utilized in fabricating a Schottky-barrier gate field effect transistor in accordance with the present invention.
Figure 2B:
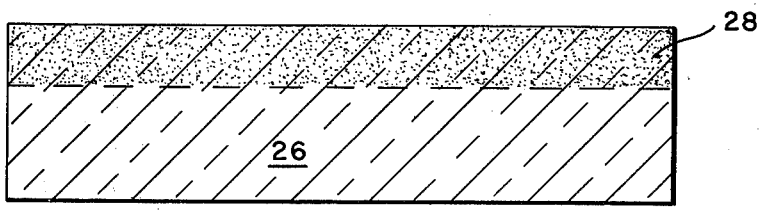

Referring now to FIG. 2, there is shown in FIG. 2a a substrate 26 of semi-insulating gallium arsenide material. It is a polished wafer doped with chromium (Cr) and having a <100> crystallographic orientation. Its resistivity is typically on the order of $10^6$–$10^8$ ohm-centimeters. On substrate 26 a conducting channel 28 is formed through ion implantation or epitaxial deposition or a combination of the two, that is, after forming an epitaxial layer, then the conductivity of that layer can be further increased by implanting it with suitable ions, such as sulphur. FIG. 2b illustrates a conducting channel 28, formed on substrate 26. If the choice is to form channel 28 through an epitaxial deposition, then on the chromium doped gallium arsenide substrate 26 an epitaxial layer 28 is formed, by either vapor phase or liquid phase epitaxy, to a thickness in the range of 0.3 μm to 1.0 μm and a carrier concentration of about $10^{17}$/cm$^3$. To maintain a good process yield it is preferred that the thickness of this layer be kept uniform to a degree consistent with the tolerance on device pinch-off voltage. Typically the required tolerance is between ±500 Å. The more uniform the thickness is, the more uniform the pinch-off voltage of the resulting devices will be. Local thickness variations, or hillocks, should be minimized to permit intimate contact of mask and wafer surface during subsequent contact photolithography. Such hillocks should not exceed a few tenths of 1 μm in height above the surrounding surface. The typical epitaxial layer is gallium arsenide; however, other semiconductor materials such as $In_xGa_{1-x}As$, with x being some hundredths to tenths, may be used for that purpose.

Alternatively, ion implantation may be used for the formation of the conducting channel 28. The chromium-doped, <100> crystallographically oriented GaAs substrate 26, may be implanted with sulphur. The exact dose/energy is determined by the desired device parameters. It may be varied to slightly adjust parameters of the device such as the variation of transconductance as a function of gate bias. For example, microwave sample devices have been built with a pinch-off voltage of a few volts, by implanting the substrate with $6 \times 10^{12}$ sulphur atoms/cm$^3$ at 140 kev, followed by a second ion implantation of $1.5 \times 10^{12}$ sulphur atoms/cm$^3$ at 50 kev. Following ion implantation the substrate surface is coated with a layer of SiO$_2$ that may be formed by pyrolysis of silane with oxygen at about 425° C. The SiO$_2$ layer prevents disassociation of the GaAs and out diffusion of the sulphur ions during a subsequent annealing step. Then the wafer must be annealed in a reducing ambient such as flowing forming gas (i.e. 90% N$_2$:10% H$_2$) for approximately 20 minutes at 800° C. This annealing step serves to electrically activate the implanted sulphur ions and to remove by annealing the lattice defects caused by implantation that would otherwise reduce the carrier mobility in the wafer. The SiO$_2$ layer is then removed using an HF etching solution. Depending on the doping parameters of the substrate, the resulting N-type doped layer exhibits a sheet resistivity in the neighborhood of 500 ohms per square and a Hall carrier mobility of about 3,500 cm$^2$/V-sec. The exact electrical parameters vary with the quality of the substrate, the implantation dose and energy, and the annealing time and temperature.

A third alternative would be to form the conducting channel by first forming an N-type epitaxial layer and then implanting it with sulphur ions or other suitable N-type ions at controlled doses and depths.

Figure 2C:
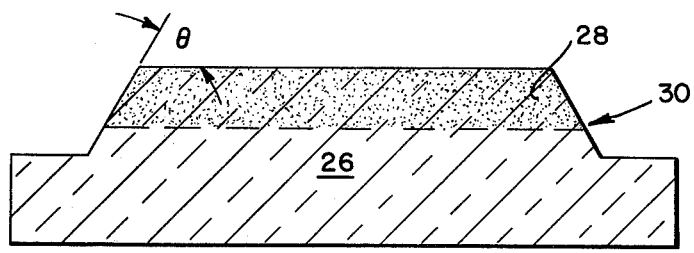
Figure 2D:
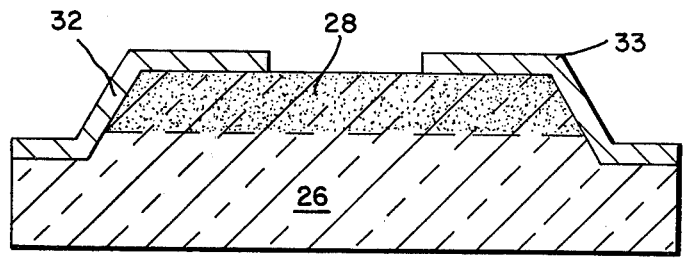

The next step is to form a photoresist mask on the top of the channel surface 28. The structure is then subjected to a suitable GaAs etchant, such as, for example, 73:22:5 parts per volume of H$_2$O:NH$_4$:30% H$_2$O$_2$, and this removes an annular outer portion of the channel region and part of the substrate under the channel, leaving a mesa-like island region 30 as shown in FIG. 2c. The mesa height is made 0.3 μm to 0.5 μm greater than the thickness of the doped channel in order to insure that parts of the etched surface exhibit properties characteristic of the underlying substrate. Although not indispensable for the performance of this device, the quality of the mesa step coverage by the metallization is improved if the step over which the gate pad connector is formed is oriented parallel to the $<0\bar{1}\bar{1}>$ crystallographic orientation on the $<100>$ surface. Thereby the orientation dependance of the common GaAs etchants is used to advantage in producing the smallest angle $\theta$. For the etching solution referred to above, this angle will be approximately 54°. After etching, the photoresist material is removed, and a second photoresist mask is formed on the exposed surface for the source and drain ohmic contacts. Using a standard metallization technique, appropriate ohmic contacts 32 and 33, as illustrated in FIG. 2d, are formed on the desired source and drain regions respectively. A suitable metallization is 1,000 Å of a Au-Ge eutectic alloy followed by 500 Å of Ni. The metal pattern produced is heated to about 450° C. for a time period ranging between 30 seconds and several minutes in order to produce an improved ohmic metal-semiconductor contact. The time-temperature cycle may be adjusted to yield the lowest contact resistance between the metal and the doped channel. It is desirable to keep this resistance below $5 \times 10^{-5}$ $\Omega$-cm$^2$. During the alloying cycle the metal tends to develop rectangular pits in the $<100>$ surface with the longer sides in the $<0\bar{1}\bar{1}>$ direction. These pits tend to grow most rapidly by propagation in that same $<0\bar{1}\bar{1}>$ direction. Using the mesa orientation prescribed above, the orientation of these etch pits is such that their growth is constrained parallel to the edge of the source to drain opening and the edge acuity of this opening is preserved.

Figure 2E:
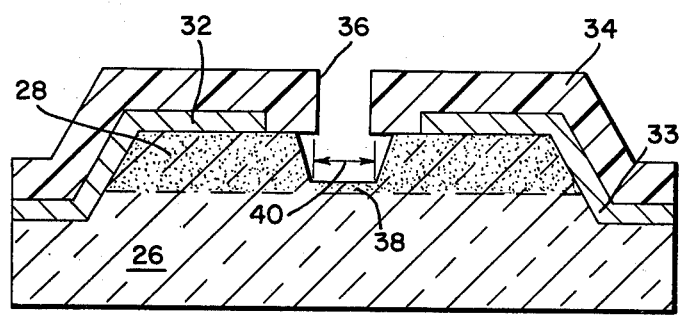

A new photoresist masking pattern 34 is formed on the structure as shown in FIG. 2e. The width of the opening 36 controls the length of the gate metal to be formed at a later stage. This width of opening 36 is typically in the range between 1 $\mu$m and 2 $\mu$m. The exposed portion of the channel 28, at 36, is etched to a predetermined depth using a wet chemical etch such as 970 mil H$_2$O:20 mil NH$_4$OH:7 mil 30% H$_2$O$_2$. The depth of the etched window is determined by the pinch-off voltage desired for the device. This provides a shallow N-type conducting channel 38 referred to as an intrinsic channel. When the doping of the channel layer is uniform, the intrinsic channel 38 thickness is related to the pinch-off voltage V$_p$ by $$V_p = (qNt^2/2k\epsilon_0) - \phi$$

where q=electronic charge=$1.6 \times 10^{19}$
N=channel doping density in atoms/cm$^3$
t=thickness of the intrinsic channel 38 (in centimeters)
k=relative dielectric constant
$\epsilon_0$=permittivity of free space
$\phi$=barrier height of the gate metal-to-semiconductor contact
$\phi \approx 0.8$ V to 0.9 V for most metals in GaAs.

Figure 2F:
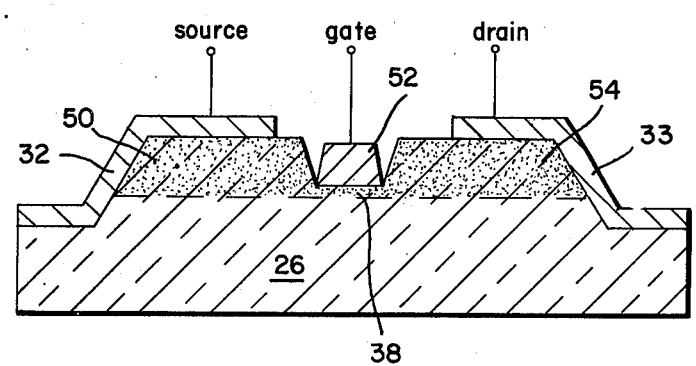

Achieving the proper depth of etch depends on an accurate knowledge of the initial channel layer thickness and the etch rate. The length 40 of the intrinsic channel 38 depends on the gate mask window 36 and again on the etch rate. It is usually somewhat greater than the gate mask window. Typically, if the gate opening 36 is 1 $\mu$m, then the length 40 of the intrinsic gate 38 is in the range of 1.1 $\mu$m to 1.5 $\mu$m. Without removing the photoresist material, a Schottky-barrier gate metal is formed through the evaporation of a metal on the intrinsic channel. Since the same mask is used for both, etching to form the intrinsic channel and for defining the gate metal length, the gate metal contact is constrained to the intrinsic channel area. The length of the gate is closely controlled and also its proximity to the source and gate regions is controlled. Aluminum is usually used to form the gate metal, but any other metal or combination of metals used for prior art Schottky gate field effect transistors may also be used with this invention. After the Schottky-barrier formation, the photoresist is dissolved and washed away, carrying the excess gate metal with it. Then conductors are attached to the metallic contacts of the source, gate and drain regions. The resulting structure is illustrated in FIG. 2f. Referring now to FIG. 2f, it contains source region 50, source ohmic contact 32, Schottky-barrier gate metal 52, intrinsic channel 38, a drain region 54 and drain ohmic contact 33.

By analogy a P-type Schottky-barrier gate field effect device may be constructed by using a P-type conducting channel.

While the invention has been described in connection with a preferred sequence of process steps to fabricate a basic field effect transistor structure, it will be understood that it is not intended to limit the invention to those process steps, their sequence, or the final structure depicted in the drawings. On the contrary, it is intended to cover all alternatives, modifications and equivalents, as may be included within the spirit and scope of the invention as defined by the appended claims. For example, various etchants can be used to control the channel geometry and thickness of the devices fabricated, and, if desired, the final device structure of FIG. 2f can be passivated using either sputter deposited SiO$_2$ or vapor deposited polycrystalline gallium arsenide (PGA).

What is claimed is:

1. A process for fabricating a field effect transistor structure comprising the steps of:
   (a) providing a substrate of semi-insulating gallium arsenide;
   (b) forming a conducting channel on a surface of said substrate and defining a substrate-conducting channel interface;
   (c) establishing source and drain ohmic contacts on predetermined portions of a surface of said conducting channel, said portions defining a source region and a drain region respectively of said transistor structure;
   (d) controllably etching a cavity in said conducting channel between said source and drain ohmic contacts, said cavity having angled side walls and an adjoining bottom wall defining a trapezoidal shaped inverted mesa region and said angled side walls extending to said surface of said conducting channel at edges remote from said source and drain ohmic contacts, whereby a conducting channel region is formed that is relatively thin with respect to said source region and said drain region; and
   (e) depositing a gate electrode member primarily on said bottom wall of said cavity and with minimal contact with said side walls for minimizing parasitic coupling between said gate electrode member and said conducting channel.

2. A process for fabricating a field effect transistor structure comprising the steps of:
   (a) forming a conducting channel on a surface of a semi-insulating gallium arsenide substrate and defining a substrate-conducting channel interface;

(b) establishing source and drain ohmic contacts on predetermined portions of a surface of said conducting channel, said portions defining a source region and drain region respectively of said transistor structure;

(c) forming a resist mask on said conducting channel for the establishment of a gate region between said source and drain ohmic contacts;

(d) forming a trapezoidal shaped inverted mesa cavity region in said conducting channel between said source and drain ohmic contacts by controllably etching through an opening in said resist mask for a time sufficient to establish a flat horizontal lower surface of said cavity region parallel to said substrate-conducting channel interface and angled side walls of said cavity region extending to said surface of said conducting channel at edges remote from said source and drain ohmic contacts, whereby a shallow conducting channel region of uniform thickness and relatively thin with respect to said source region and said drain region is formed; and (e) forming a Schottky-barrier gate electrode primarily on said flat horizontal lower surface using said resist mask to determine the location and size of said gate electrode.

3. A process as set forth in claim 2, wherein said gallium arsenide substrate has a bulk resistivity between $10^6$ and $10^8$ ohm-centimeters and has chromium as the dominant electrically active impurity.

4. A process as set forth in claim 3 wherein said conducting channel is formed by growing a thin epitaxial active layer on said substrate.

5. A process as set forth in claim 3 wherein said conducting channel is formed by implanting a suitable impurity in said substrate.

6. A process as set forth in claim 3 wherein said conducting channel is formed by growing a thin epitaxial active region and then implanting said epitaxial active region with suitable ions at controlled depths and dosages.

7. A process for fabricating a self-aligned Schottky-barrier gate gallium arsenide field effect transistor comprising the steps of:

(a) providing a gallium arsenide substrate having a bulk resistivity between $10^6$ and $10^8$ ohm-centimeters and having chromium as the dominant electrically active impurity;

(b) forming an N-type epitaxial layer having a chosen carrier concentration, and defining a substrate-epitaxial layer interface;

(c) implanting an N-type impurity in said epitaxial layer thereby increasing the conductivity of said layer;

(d) forming a diffusion barrier layer on the surface of said N-type epitaxial layer subsequent to the N-type implantation thereof whereby the stoichiometry of said surface is preserved;

(e) annealing said structure at a predetermined elevated temperature sufficient to electrically activate said N-type ions implanted therein and to anneal out substantial amounts of ion implantation damage, whereby carrier mobilities in excess of 3,000 $cm^2$/volt-second may be obtained in a layer of substantially uniform thickness;

(f) establishing source and drain regions on said implanted epitaxial layer and respective source and drain electrodes on said regions after first making the necessary openings on said barrier layer, and subsequently removing said barrier layer through a chemical etch;

(g) forming a resist mask on said surface of said implanted epitaxial layer for the establishment of a gate region between said source and drain electrodes;

(h) forming a trapezoidal shaped inverted mesa cavity region in said implanted epitaxial layer between said source and drain electrodes by applying a preferential chemical etchant for a time sufficient to establish a flat horizontal lower surface of said cavity region parallel to said substrate-epitaxial layer interface and angled side walls of said cavity region extending to said surface of said implanted epitaxial layer at edges remote from said source and drain electrodes, whereby a shallow conducting channel region of uniform thickness, relatively thin with respect to said source and drain regions, and relatively close to said source region is formed; and (i) forming a Schottky-barrier gate primarily on said shallow conducting channel.

8. A process as set forth in claim 7 wherein:
(a) said N-type epitaxial layer has a thickness ranging between 0.5 and 0.6 $\mu$m; and
(b) said N-type epitaxial layer is implanted to a depth of approximately 0.2 $\mu$m with sulphur whereby the conductivity of said conducting channel is substantially enhanced.

9. A process as set forth in claim 7 wherein said barrier layer formed on said substrate prior to annealing is removed after said annealing and replaced with a new barrier layer.

10. The process set forth in claim 7 wherein:
(a) said gallium arsenide substrate has a $<100>$ crystallographic orientation; and
(b) said preferential chemical etchant comprises 970 milliliters (ml) of water, 20 ml of ammonium hydroxide ($NH_4OH$), and 7 ml of 30% hydrogen peroxide ($H_2O_2$).

11. In a method for fabricating a gallium arsenide Schottky-barrier gate field effect transistor including the steps of forming a conducting channel on a surface of a semi-insulating gallium arsenide substrate, establishing source and drain ohmic contacts on predetermined portions of a surface of said conducting channel and thereby defining source and drain regions respectively, the improvement which comprises:

(a) forming a resist etching mask on said conducting channel having an opening located between said source and drain contacts and closer to said source contact than to said drain contact;

(b) forming a trapezoidal shaped inverted mesa cavity region in said conducting channel between said source and drain contacts and closer to said source contact than to said drain contact, by applying a preferential chemical etchant through said opening in said resist mask for a time sufficient to establish a flat horizontal lower surface of said cavity region parallel to the interface between said substrate and said conducting channel and angled said walls of said cavity region extending to said surface of said conducting channel at edges remote from said source and drain contacts, whereby a shallow conducting channel region of uniform thickness and relatively thin with respect to said source and drain regions is formed; and (c) forming a Schottky-barrier gate electrode through evaporation of a metal primarily on said flat horizontal lower surface using said resist mask as an evaporation mask.

12. A process for fabricating a self-aligned Schottky-barrier gate gallium arsenide transistor comprising the steps of:
(a) forming a conducting channel on a surface of a semi-insulating gallium arsenide substrate and defining a substrate-conducting channel interface;
(b) removing through etching an annular portion of said conducting channel providing an insulated mesa-like conducting channel portion on said substrate;
(c) forming source and drain ohmic contacts on predetermined areas of a surface of said conducting channel portion, said areas defining a source region and a drain region respectively;
(d) forming a photoresist etching mask on said channel portion having an opening of predetermined size and located between said source and drain contacts and relatively close to said source contact;
(e) forming a trapezoidal shaped inverted mesa cavity region in said conducting channel, between said source and drain ohmic contacts, by applying a preferential chemical etchant through an opening in said photoresist mask for a time sufficient to establish a flat horizontal lower surface of said cavity region parallel to said substrate-conducting channel interface and angled side walls of said cavity region extending to said surface of said conducting channel at edges remote from said source and drain ohmic contacts, whereby there is formed a shallow conducting channel region of uniform thickness and relatively thin with respect to said source region and said drain region, whose size and location is determined by said photoresist mask; and (f) evaporating a predetermined metal in said opening in said photoresist mask, using said photoresist mask as an evaporation mask for the formation of a Schottky-barrier gate electrode primarily on said shallow conducting channel region; and
(g) removing said photoresist mask to thereby leave said Schottky-barrier gate electrode formed on said shallow conducting channel region.

13. A process for fabricating a field effect transistor structure comprising the steps of:
(a) providing a substrate of semi-insulating gallium arsenide with a <100> crystallographic orientation;
(b) forming a conducting channel on a surface of said substrate and defining a substrate-conducting channel interface;
(c) establishing source and drain ohmic contacts on predetermined portions of a surface of said conducting channel, said portions defining a source region and a drain region respectively;
(d) controllably and anisotropically etching a cavity in said conducting channel between said source and drain ohmic contacts, to a predetermined thickness above said substrate-conducting channel interface, said cavity having angled side walls and an adjoining bottom wall defining a trapezoidal shaped inverted mesa region and said angled side walls extending to said surface of said conducting channel at edges remote from said source and drain ohmic contacts, to thereby form a conducting channel region that is relatively thin with respect to said source region and said drain region; and
(e) depositing a gate electrode member primarily on said bottom wall of said cavity and with minimal contact with said side walls thereof for minimizing parasitic coupling between said gate member and said conducting channel.

* * * * *